(12) United States Patent
Nagareda et al.

(10) Patent No.: US 7,889,503 B2
(45) Date of Patent: Feb. 15, 2011

(54) ELECTRONIC APPLIANCE HAVING AN ELECTRONIC COMPONENT AND A HEAT-DISSIPATING PLATE

(75) Inventors: Takeshi Nagareda, Kyoto (JP); Yasuhisa Kitano, Kyoto (JP); Sadayoshi Hattori, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 150 days.

(21) Appl. No.: 11/822,934

(22) Filed: Jul. 11, 2007

(65) Prior Publication Data

US 2008/0055861 A1 Mar. 6, 2008

(30) Foreign Application Priority Data

Aug. 31, 2006 (JP) ............................. 2006-235940

(51) Int. Cl.
*H05K 7/20* (2006.01)
*F28F 7/00* (2006.01)
*H01L 23/34* (2006.01)
*H01B 7/42* (2006.01)

(52) U.S. Cl. ........................ 361/719; 361/709; 361/710; 361/800; 361/818; 361/753; 165/80.2; 165/80.3; 165/185; 257/712; 257/713; 257/722; 174/16.1; 174/16.3

(58) Field of Classification Search ................. 361/704, 361/709, 710, 712, 718, 719, 720, 799, 800, 361/818, 753; 165/80.2–80.3, 185; 257/712–713, 257/722; 174/16.1, 16.3

See application file for complete search history.

(56) References Cited

U.S. PATENT DOCUMENTS

| | | | | |
|---|---|---|---|---|
| 5,804,875 A | * | 9/1998 | Remsburg et al. | 257/718 |
| 5,910,884 A | * | 6/1999 | Garza et al. | 361/690 |
| 6,167,949 B1 | * | 1/2001 | Langley et al. | 165/104.33 |
| 6,243,265 B1 | | 6/2001 | Wong et al. | |
| 6,498,733 B2 | * | 12/2002 | Murasawa | 361/816 |
| 6,577,504 B1 | * | 6/2003 | Lofland et al. | 361/709 |
| 6,714,416 B1 | * | 3/2004 | McLeod et al. | 361/719 |
| 6,742,573 B2 | * | 6/2004 | Sasaki et al. | 165/80.3 |
| 7,265,984 B2 | * | 9/2007 | Numata | 361/719 |
| 2002/0029867 A1 | * | 3/2002 | Sauer | 165/80.3 |

(Continued)

FOREIGN PATENT DOCUMENTS

CN 1534775 A 10/2004

(Continued)

OTHER PUBLICATIONS

European Search Report from EP 07 11 2726 completed Jun. 12, 2009.

(Continued)

*Primary Examiner*—Zachary M Pape
(74) *Attorney, Agent, or Firm*—Nixon & Vanderhye P.C.

(57) ABSTRACT

An electronic appliance includes a circuit board mounted with an electronic-circuit component. The circuit board is covered with a shield, and a metallic heat-dissipating member is arranged on the electronic-circuit component. The shield is grounded on the circuit board, and arranged such that at least one of the surfaces is in the vicinity of the heat-dissipating member. The heat-dissipating member is grounded on the circuit board by a ground member, and at the periphery of the ground member, magnetic members are arranged.

11 Claims, 7 Drawing Sheets

U.S. PATENT DOCUMENTS

| | | | |
|---|---|---|---|
| 2002/0084060 A1* | 7/2002 | Sasaki et al. | 165/80.3 |
| 2004/0190260 A1* | 9/2004 | Sasaki | 361/704 |
| 2006/0099403 A1 | 5/2006 | Johnson | |
| 2006/0126309 A1* | 6/2006 | Bolle et al. | 361/719 |
| 2006/0146499 A1* | 7/2006 | Reents | 361/704 |
| 2006/0203453 A1* | 9/2006 | Chen | 361/704 |
| 2009/0289352 A1* | 11/2009 | Horie | 257/712 |

FOREIGN PATENT DOCUMENTS

| | | |
|---|---|---|
| CN | 2681351 Y | 2/2005 |
| CN | 1797278 A | 7/2006 |
| EP | 1 420 625 | 5/2004 |
| JP | 2004-303860 | 10/2004 |

OTHER PUBLICATIONS

Chinese Patent Office Action in corresponding Chinese application and English translation.

\* cited by examiner

| ESD TEST (AERIAL DISCHARGES) | | NO MALFUNCTION | | | | NO BREAKAGE | | | | | | |
|---|---|---|---|---|---|---|---|---|---|---|---|---|
| TESTED PART | | 6k | 7k | 8k | 9k | 10k | 11k | 12k | 13k | 14k | 15k | 16k |
| PRESENCE OF FERRITE RING | | | | | | | | | | | | |
| CONNECTOR FOR PERIPHERAL EQUIPMENT | + | | | ○ | ○ | ○ | ○ | ○ | ○ | ○ | ○ | ○ |
| CONNECTOR FOR PERIPHERAL EQUIPMENT | − | | | ○ | ○ | ○ | ○ | ○ | ○ | ○ | ○ | ○ |
| AV CONNECTOR | + | | | ○ | ○ | ○ | ○ | ○ | | ○ | | ○ |
| AV CONNECTOR | − | | | ○ | ○ | ○ | | ○ | | ○ | | ○ |
| ABSENCE OF FERRITE RING | | | | | | | | | | | | |
| CONNECTOR FOR PERIPHERAL EQUIPMENT | + | | △ | △ | ○ | | | | | | | |
| CONNECTOR FOR PERIPHERAL EQUIPMENT | − | | | ○ | △ | | | | | | | |
| AV CONNECTOR | + | ○ | △ | | | | | | | | | |
| AV CONNECTOR | − | ○ | △ | | | | | | | | | |

○ : TEST OK    △ : MALFUNCTION    × : BREAKAGE

ELECTRONIC APPLIANCE HAVING AN ELECTRONIC COMPONENT AND A HEAT-DISSIPATING PLATE

CROSS REFERENCE OF RELATED APPLICATION

The disclosure of Japanese Patent Application No. 2006-235940 is incorporated herein by reference.

BACKGROUND OF THE INVENTION

1. Field of the Invention

The invention relates to electronic appliances. More specifically, the present invention relates to an electronic appliance having an electronic component and a heat-dissipating plate dissipating heat generated from the electronic component.

2. Description of the Related Art

As a conventional appliance of this kind, one disclosed in Japanese Patent Application Laid-Open No. 2004-303860 is widely known. In the related art, an electronic component is housed in a metallic electronic equipment housing so as to be mounted on a top surface of a two-layer substrate formed with a ground layer on the underside. A heat-dissipating plate is connected with each of the electronic equipment housing and the underside of the two-layer substrate (that is, ground layer). The heat generated by the electronic component is transmitted to the two-layer substrate, especially, the heat-dissipating plate through the through hole, and dissipated from the heat-dissipating plate.

Alternatively, the heat-dissipating plate is provided in contact with the electronic component on the side of the two-layer substrate where the electronic component is mounted.

However, in a related art, if the heat-dissipating plate is provided on the underside, a substrate is inserted between the electronic component and the heat-dissipating plate, and therefore, heat of the electronic component is not necessarily effectively transmitted to the heat-dissipating plate, resulting in inadequate heat-dissipating effect. On the other hand, in a case that the heat-dissipating plate is provided on the top surface, a heat-dissipating effect is high, but when an electrostatic discharge (Electro-Static Discharge: ESD) occurs, the electronic component is seriously damaged. Because the heat-dissipating plate provided in contact with the electronic component is a route of pulse-type charges by the ESD.

Thus, in the related art, only the any one of the heat-dissipating effect and the ESD resistance is improved.

SUMMARY OF THE INVENTION

Therefore, a novel electronic appliance has been invented and is disclosed herein.

Another electronic appliance disclosed herein may be capable of effectively dissipating heat, and being resistant to an electrostatic discharge.

An electronic appliance (10: reference numeral designating a portion corresponding in the embodiments) according to a first embodiment is an electronic appliance comprising a circuit board (36), an electronic-circuit component (38, 40) mounted on the circuit board, and a metallic heat-dissipating member (48) placed on the electronic-circuit component for dissipating heat generated in the electronic-circuit component. The electronic appliance comprises a shield (44Aa) covering the circuit board for being grounded on the circuit board, and arranged such that at least one of the surfaces is positioned in the vicinity of the heat-dissipating member; a ground member (48c) for grounding the heat-dissipating member on the circuit board; and a magnetic member (52) arranged in the vicinity of a periphery of the ground member.

In a first embodiment, an electronic-circuit component is mounted on a circuit board. On the electronic-circuit component, a metallic heat-dissipating member is placed for dissipating heat generated in the electronic-circuit component. A shield covering the circuit board is grounded on the circuit board, and arranged such that at least one of the surfaces is positioned in the vicinity of the heat-dissipating member. The heat-dissipating member is grounded on the ground member by the circuit board. In the vicinity of a periphery of the ground member, a magnetic member is arranged. The magnetic member comprises an inductor in cooperation with the ground member.

According to the first embodiment, the inductor is formed by the ground member and the magnetic member, so that an impedance of the ground member is heightened on the side of a high-frequency. As a result, in the high frequency band, an impedance of the shield is relatively lower than that of the ground member. It should be noted that the high frequency band here includes a frequency band (200 MHz-500 MHz, for example) to which electromagnetic waves interfering an operation of the electronic-circuit component belongs. Therefore, pulse-type charges applied by an electrostatic discharge (ESD) to the heat-dissipating member or the vicinity thereof flow to the circuit board through the shield.

For obtaining a high heat-dissipating effect, the heat-dissipating member is required to be contacted or absolutely contacted to the electronic-circuit component, and whereby, the ground member is closely contact with the electronic component. The shield is farther from the electronic-circuit component than the ground member, and therefore, the risk of damage or malfunction of the electronic-circuit component due to an ESD is reduced.

Furthermore, the electronic-circuit component is electro-magnetically shielded by the shield, and electromagnetic interference (Electro-Magnetic Interference: EMI) is also prevented. Then, such a shielding effect by the shield further reduces a risk of the damage or the malfunction of the electronic-circuit component due to an ESD.

An electronic appliance according to a second invention is dependent on the first invention, and the shield is formed with a slit (44Ab), and at least a part of the heat-dissipating member is exposed from the slit to the outside of the shield.

According to the second embodiment, by forming a slit on the shield, at least a part of the heat-dissipating member can be exposed from the slit to the outside of the shield, capable of obtaining a high heat-dissipating effect.

An electronic appliance according to a third embodiment is dependent on the second invention, and the heat-dissipating member comprises a heat-dissipating plate (48a) and a base (48b) supporting the heat-dissipating plate, the base is placed between the shield and the electronic-circuit component, and a part of the heat-dissipating plate is exposed from the slit to the outside of the shield.

By inserting the base between the shield and the electronic-circuit component, electromagnetic leakage at the slit is prevented, and by exposing a part of the heat-dissipating plate, a heat-dissipating effect is enhanced.

An electronic appliance according to a fourth embodiment is dependent on the third embodiment, and further comprises a heat-conducting sheet (50). The heat-conducting sheet has a top surface and a bottom surface which are respectively brought into intimate contact with a bottom surface of the base and a top surface of the electronic-circuit component.

According to the fourth embodiment, heat of the electronic-circuit component is effectively transmitted to the base of the heat-dissipating member through the heat-conducting sheet, and dissipated from the heat-dissipating plate exposed outside the shield, capable of enhancing the heat-dissipating effect. Additionally, if a heat-conducting sheet mixed with a magnetic powder is used, an EMI suppressing effect can also be obtained.

An electronic appliance according to a fifth embodiment is dependent on the first invention, and the magnetic member is ring-shaped ferrite.

By the way, as a result of forming a slit on the shield, an electromagnetic leakage might occur in the slit, and an EMI might be increased. In addition, the heat-dissipating member exposed from the slit functions as an antenna, which might further increase an EMI.

However, in the fifth embodiment, a ring-shaped ferrite is utilized as a magnetic member, so that the ground member becomes high loss at a high frequency band, and the electromagnetic waves at high frequency band are reduced. Thus, the increase in an EMI due to provision of the slit is reduced.

Such high-frequency noise absorption by ferrite extends to the electromagnetic waves generated when a high frequency current by the ESD flows through the shield, capable of enhancing an ESD resistance.

According to one or more of the disclosed embodiments of the present invention, effective heat dissipation can be performed, and a resistance to the electrostatic discharge is furthermore improved. In addition, electromagnetic interference is prevented.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

As shown in FIG. 1-FIG. 5, a game apparatus 10 of one embodiment of the invention includes a substantially rectangular housing 12. The housing 12 is formed by a plurality of metal plates and a plurality of metallic screws (not illustrated) for fixing them.

Figure 1:
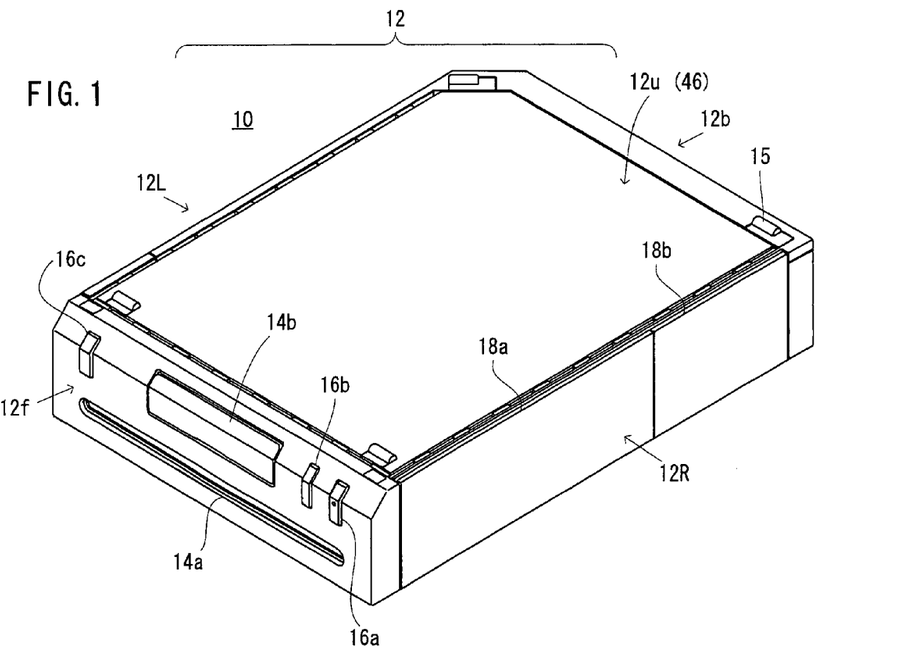
FIG. 1 is a perspective view of one embodiment of the present invention as seen from a front above.
Figure 2:
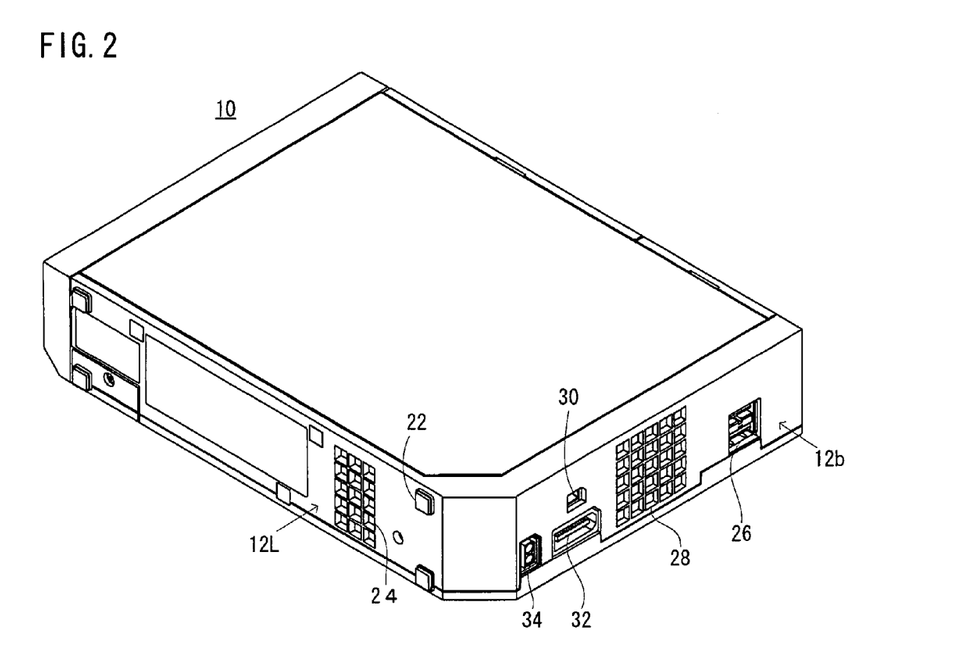
FIG. 2 is a perspective view of FIG. 1 embodiment as seen from rear below.
Figure 3:
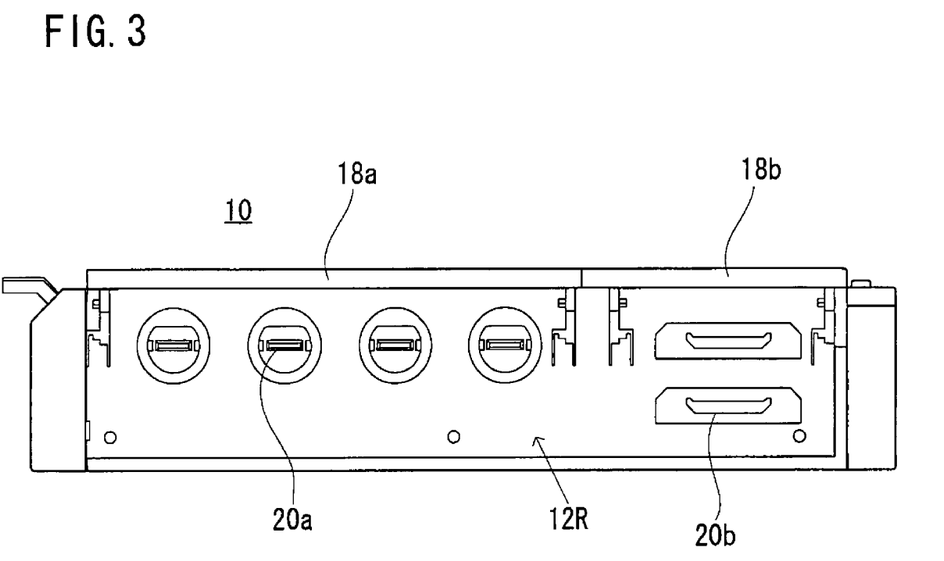
FIG. 3 is an illustrative view showing a hidden part by a cover of a right side surface in FIG. 1 embodiment.

On a front surface 12f of the housing 12, disk slot 14a, an SD card slot cover 14b, a power button 16a, a reset button 16b, a disk eject button 16c, etc. are formed. On a right side surface 12R, openable closeable covers 18a and 18b, and a connector 20a for various controllers (not illustrated), a memory card slot 20b, etc. are provided. On the left side surface 12L, a rubber foot 22, an intake hole 24, etc. are provided. On a back surface 12b, a USB connector 26, an exhaust hole 28, a connector for peripheral equipment 30, an AV connector 32, a DC connector 34, etc. are provided. A bottom surface 12u is provided with a rubber foot 15, etc. The above-described metallic screws are hidden under the rubber foots 22 and 15.

Figure 4:
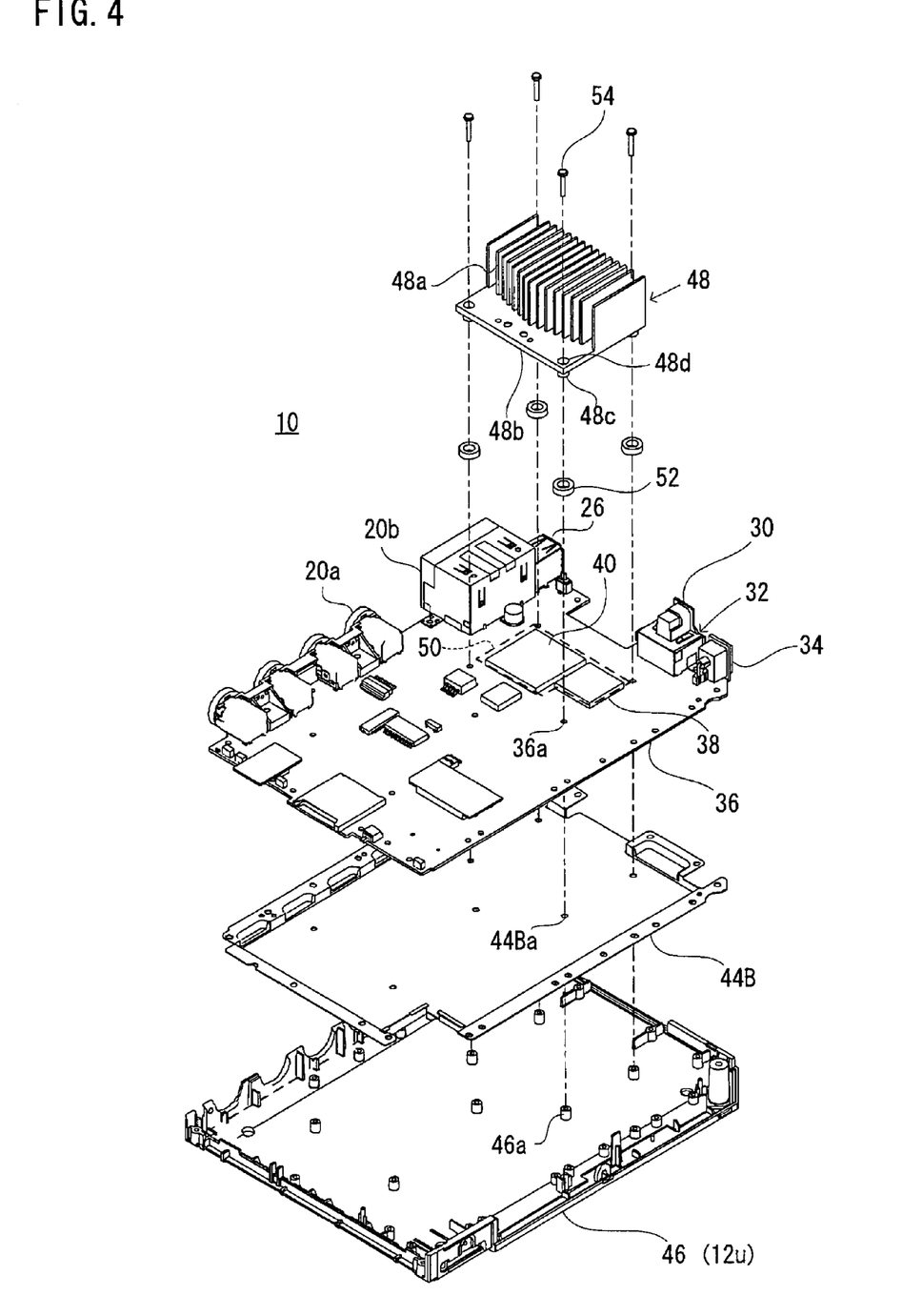
FIG. 4 is an illustrative view showing a part of an assembly process of FIG. 1 embodiment.
Figure 5:
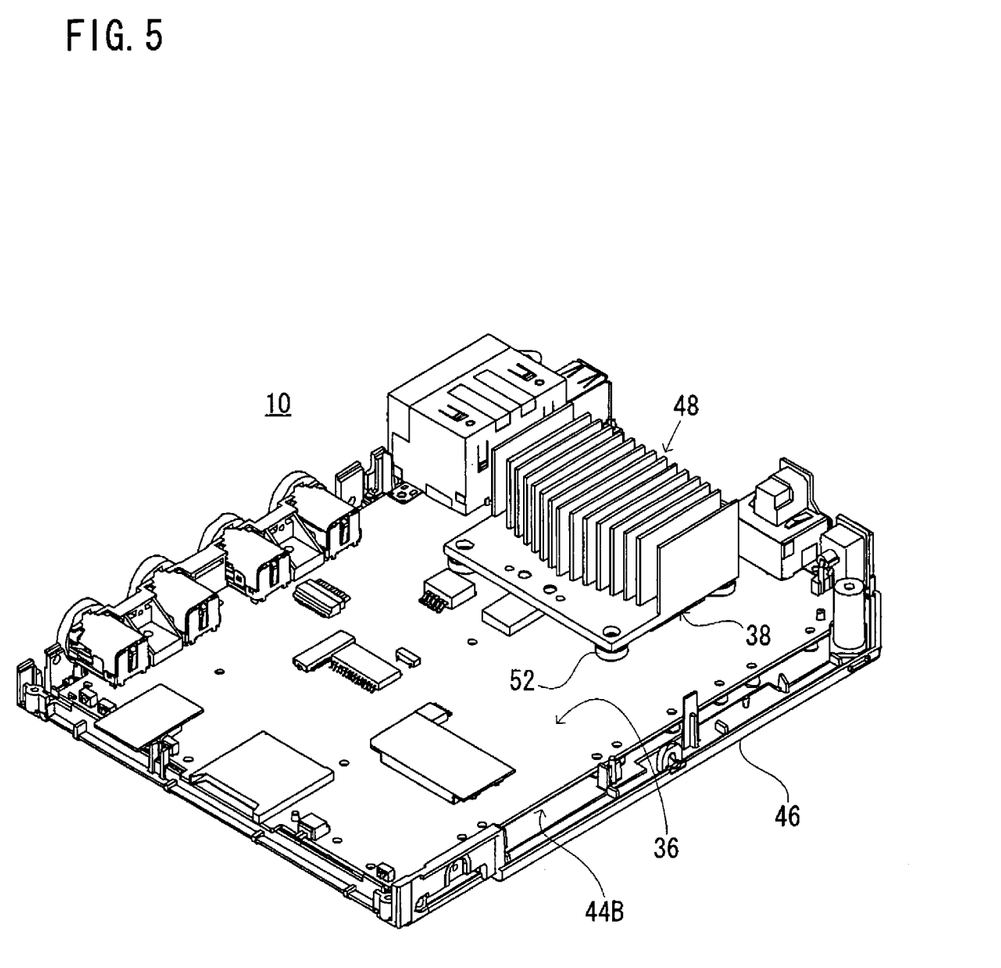
FIG. 5 is a perspective view showing a result of FIG. 4 process (before the completion of the shield)

With reference to FIG. 4 and FIG. 5, the housing 12 constructed as described above includes a substrate 36 mounted with an electronic component like a GPU 38, a CPU 40, etc. The substrate 36 is secured to a bottom 46 (corresponding to the bottom surface 12u of the housing 12) via a metallic lower shield member 44B. It should be noted that the substrate 36 has a multi-layer structure including a ground layer therein, and has a six-layer structure here, and the fifth layer is a ground layer (36e: see FIG. 8).

The above-described connectors are also arranged on the substrate 36. More specifically, the substrate 36 is mounted with various controllers for connector 20a and 20b on the left long side, and a connector for peripheral equipment 30 and an AV connector 32 on the right depth thereof.

Each of the CPU 38 and the GPU 40 being an exothermic electronic component has roughly the same thickness, and arranged at the back and the center of the substrate 36. Then, on a top surface of the CPU 38 and the GPU 40, a metallic (aluminum, for example) heat dissipating member 48 is arranged. The heat dissipating member 48 has a plurality of heat dissipating fins 48a and a base 48b in which these are buried. At each of the four corners of the base 48b, a downward protrusion 48c taking a shape of cylinder, and a tapped hole 48d penetrating the base itself and the protrusion 48c are formed. The height of the protrusion 48c is slightly above the thicknesses of the CPU 38 and the GPU 40. That is, the protrusion 48c is a leg for supporting the heat dissipating member 48 at a top surface position of the CPU 38 and the GPU 40.

It is preferable that a heat-conducting sheet 50 is inserted between the heat dissipating member 48, and the CPU 38 and GPU 40. The heat-conducting sheet 50 is made of material high in flexibility and thermal conductivity (silicone, or the like), and has the top surface thereof closely brought into contact with the bottom surface of the heat dissipating member 48, and the bottom surface thereof closely brought into contact with the top surface of the CPU 38 and the GPU 40. The heat of the CPU 38 and the GPU 40 is efficiently transmitted to the heat dissipating member 48 through the thermal conduction sheet 50, and emitted from the heat dissipating member 48. By thus providing the heat-conducting sheet 50, it is possible to heighten a heat-dissipating effect of the heat dissipating fin 48.

The substrate 36 is formed with four through holes 36a respectively corresponding to four tapped holes 48d of the heat dissipating member 48. A lower shield member 44B is formed with four tapped holes 44Ba, and the bottom 46 is formed with four bearings 46a. Also, four ferrite rings 52 are arranged between the heat dissipating member 48 and the substrate 36. The length (thickness) of the ferrite ring 52 is roughly the same as the height of the protrusion 48c, and the internal diameter thereof is slightly larger than the diameter of the protrusion 48c. Thus, the protrusion 48c is fit into the ferrite ring 52, and the side surface of the protrusion 48c is covered with the ferrite ring 52.

It should be noted that the ferrite ring 52 is hard and brittle, and therefore, a double-faced tape (not illustrated) having elasticity is preferably applied to a top surface and/or lower surface of the ferrite ring 52. Thus, it is possible to improve resistance properties to impact like falling.

Figure 8:
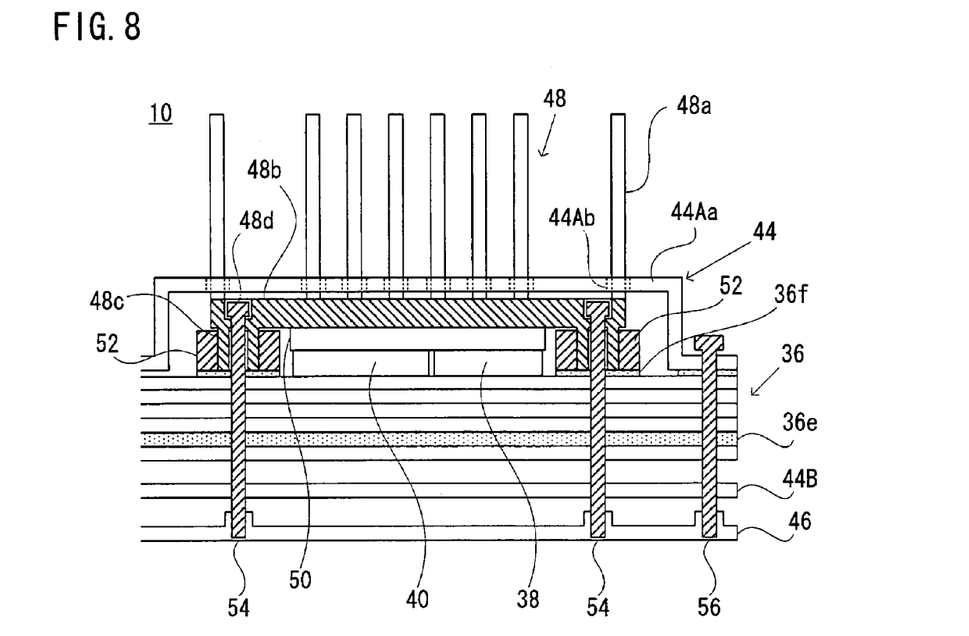
FIG. 8 is a cross-sectional view taken along the dotted line A-A' in FIG. 7.

Each of four metallic screws 54 for integrating each of the above-described members, that is, the heat dissipating fin 48, the ferrite ring 52, the substrate 36, the lower shield member 44B and the bottom 46 is screwed from a corresponding tapped hole 48d into the bearing 46a through a ferrite ring 52, a through hole 36a and a tapped hole 44Ba. Thus, the heat dissipating fin 48 is fixed at a position being brought into contact with or being close enough to the top surface of the CPU 38 and GPU 40 as shown in FIG. 5. Furthermore, as shown in FIG. 8, a grounded surface 36f is formed at a portion being contact with the protrusion 48c on the top surface of the substrate 36, and through the electrical connection with the ground layer 36e via wiring within the substrate, the heat dissipating fin 48 is grounded. In this state, the heat dissipating fin 48, the ground layer 36e of the substrate 36 and the lower shield member 44B are electrically connected to thereby give them equal potential (ground potential) with each other.

Figure 6:
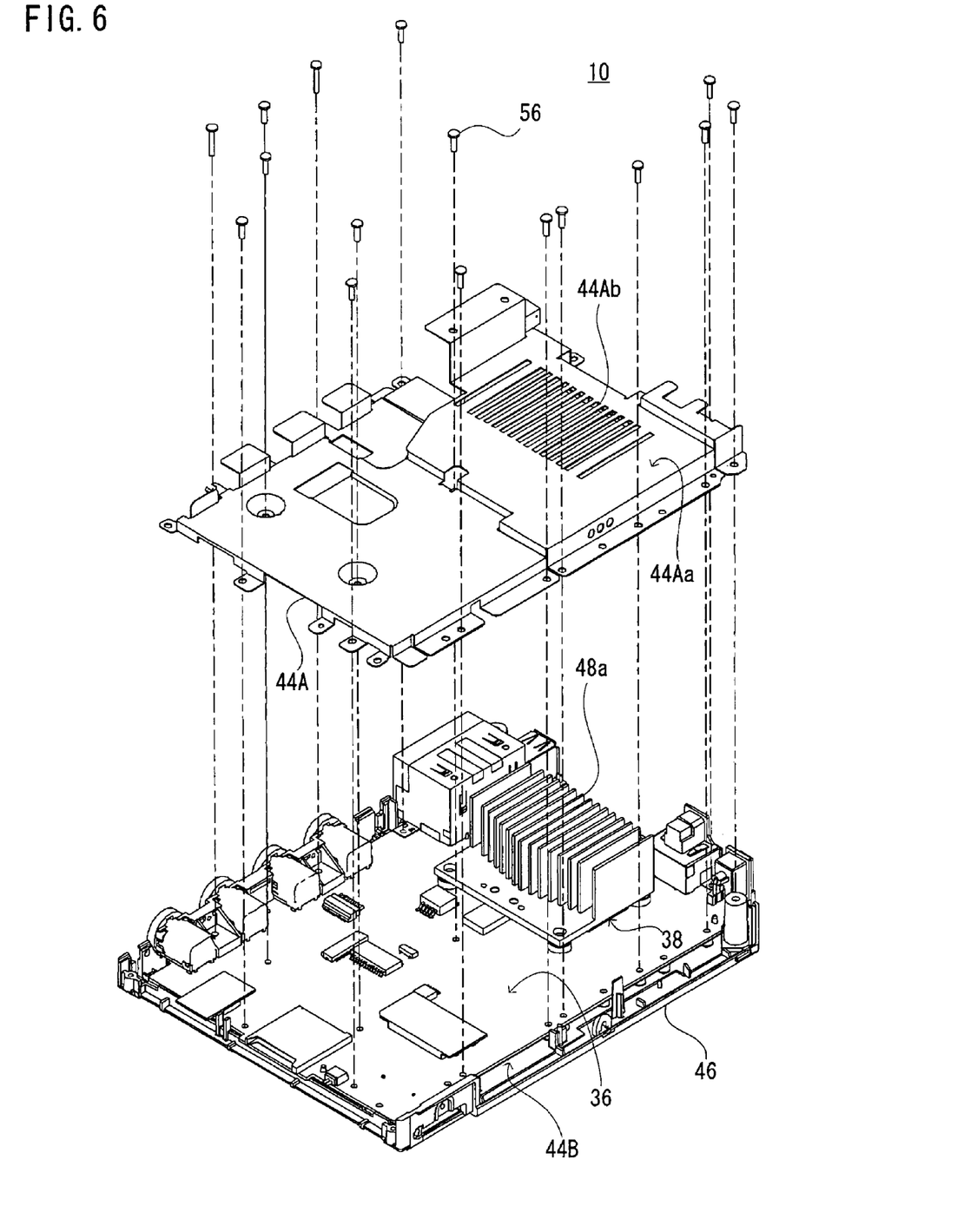
FIG. 6 is an illustrative view showing a process continued from the FIG. 4 process.
Figure 7:
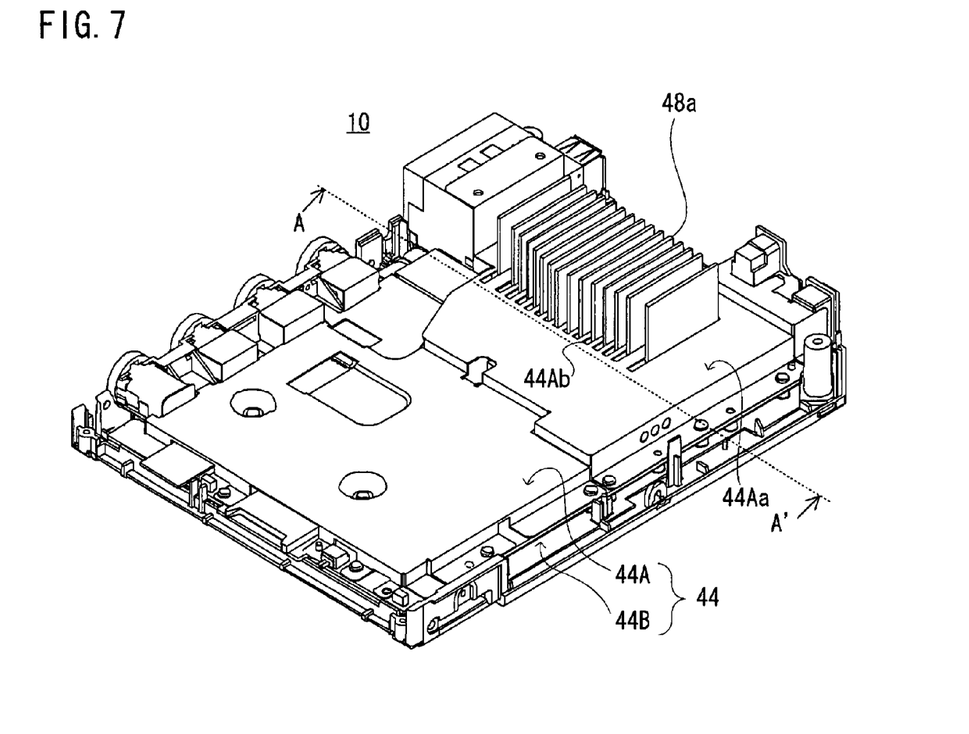
FIG. 7 is a perspective view showing a result of the FIG. 6 process (after completion of the shield)

Next, as shown in FIG. 6-FIG. 8, after completion of the above-described integrating process, the upper shield member 44A is attached with the plurality of metallic screws 56 from the top surface side of the substrate 36. As a result, as shown in FIG. 7, the shield 44 is constituted by the upper shield member 44A and the lower shield member 44B to shield the inside electromagnetically. That is, it is possible to prevent electromagnetic waves generated in the shield from leaking to the outside and electromagnetic waves from entering in the shield from the outside, capable of reducing an EMI.

The upper shield member 44A is formed with a convex portion 44Aa at a position corresponding to the heat dissipating member 48. The convex portion 44Aa has a height corresponding to the height of the base 48b of the heat dissipating member 48, and has slits 44Ab for the plurality of heat dissipating fins 48a on the top surface. The base 48b is directly (or via the thermal conduction sheet 50) brought into contact with the CPU 40, etc. in the shield, and the plurality of heat dissipating fins 48a are exposed from the slits 44Ab to the outside of the shield. Thus, heat emitted by the CPU 40, etc. is efficiently transmitted to the base 48b, and dissipated from the plurality of heat dissipating fins 48a to the outside of the shield. That is, heat is not stopped within the shield, capable of obtain a high heat dissipating efficiency. Furthermore, the base 48b has an operation for preventing electromagnetic leakage in the slit 44Ab from occurring.

On the other hand, the heat-dissipating plate 48a exposed from the shield 44, which functions as an antenna, takes in electromagnetic waves from the outside to the shield, and emits the electromagnetic waves generated in the shield to the outside. Thus, an ESD resistance may be aggravated, resulting in increase in EMI.

However, as shown in FIG. 4 and FIG. 8, since a ferrite ring 52 is attached to the protrusion 48c grounded with the heat-dissipating plate 48a, a high frequency current flowing through a route from the heat-dissipating plate 48a to the grounded surface 36f is reduced. In other words, it is considered that a function as an antenna of the heat-dissipating plate 48a is reduced at a high frequency band.

Furthermore, the ferrite ring 52 is attached to the protrusion 48c to thereby form an inductor, capable of heightening an impedance of the protrusion 48c and the metallic screw 54 at the high frequency band. Such an increase in impedance at the high frequency band contributes to avoid a breakdown and a malfunction of the CPU 40, etc. due to an ESD. For example, when an electrostatic discharge occurs to the connector for peripheral equipment 30, pulse-typed,electric charges are applied to the heat-dissipating plate 48a by a second discharge from the connector for peripheral equipment 30, and may flow to the grounded surface 36f, etc. (ground) of the substrate 36 from the heat-dissipating plate 48a through the protrusion 48c and the metallic screw 54. A strong high-frequency (200 MHz-500 MHz, for example) electromagnetic wave occurring by such a high frequency current may apply serious damage to the CPU 40, etc. adjacent to the heat-dissipating plate 48a.

However, an impedance of the protrusion 48c and the metallic screw 54 at the high frequency band is increased by the ferrite ring 52, and whereby, a high frequency current by an ESD at the high frequency band flows through other grounded routes with low impedances, specifically, the shield 44. The high frequency current thus flowing in the shield 44 may generate high-frequency electromagnetic waves, but due to the source being away from the CPU 40, etc. and an shielding effect of the shield 44 itself, a direct influence on the CPU 40, etc. by the electromagnetic waves is little. Furthermore, other high frequency currents may be generated at the heat-dissipating plate 48a, etc. by the electromagnetic waves, but it is considered that this may be reduced by the operation of the ferrite ring 52, resulting in less indirect influence.

In general, it is considered that if the axis of the protrusion 48c is surrounded by any magnetic rings without being restricted to ferrite, the impedance of the protrusion 48c is heightened, and therefore, a high frequency current by an ESD flows through the shield 44 having a relatively low impedance, but by using materials being a high loss at a high frequency as well as a high impedance at a high frequency, a more remarkable effect can be obtained.

Figure 9:
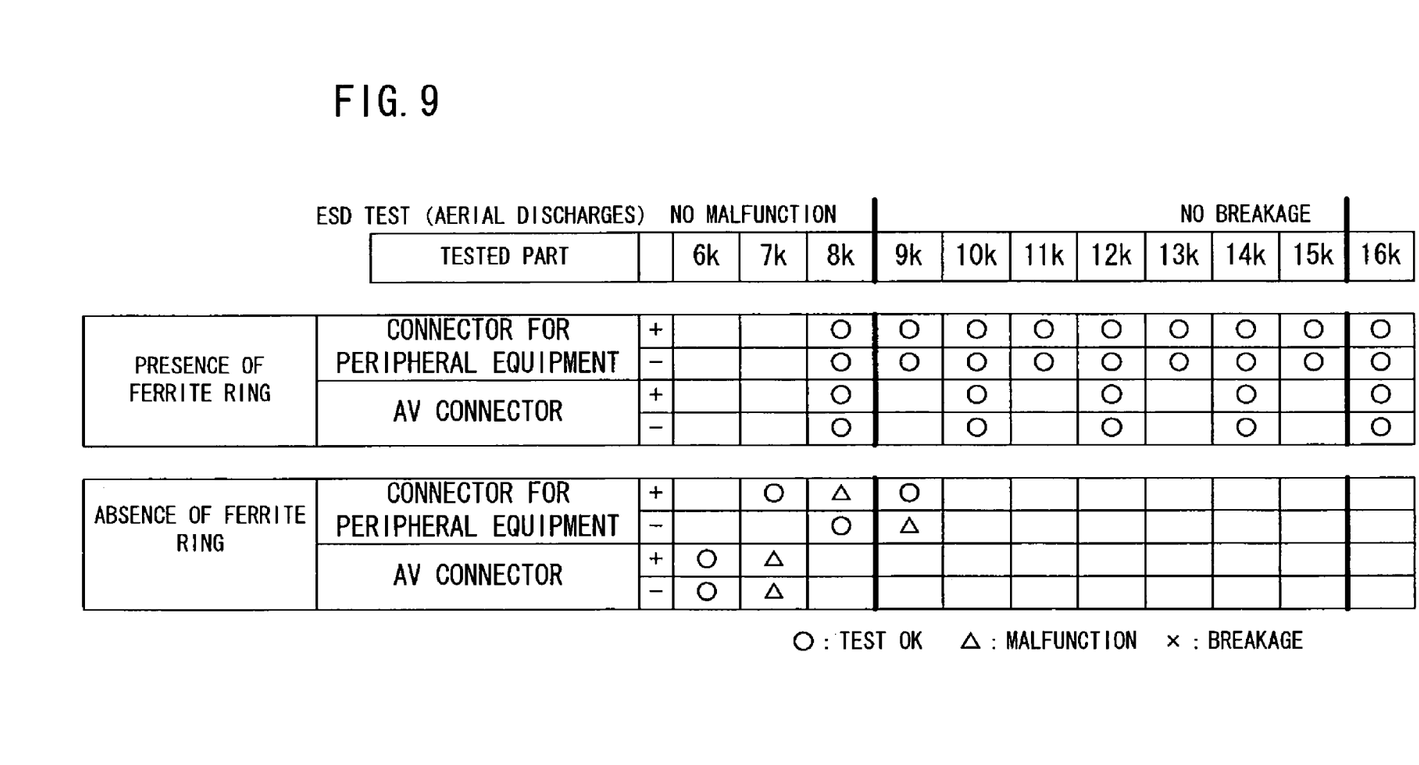
FIG. 9 is a table showing a part of a result from an ESD test with respect to FIG. 1 embodiment.

FIG. 9 shows a part of a result of an ESD test performed on the game apparatus 10 thus constructed. This is a result of the test in which aerial discharges of 6kV-16kV are performed on each of the connector for peripheral equipment 30 and the AV connector 32 near the heat dissipating fin 48 in the presence of the ferrite ring 52 and in the absence thereof. The reference for passing the test by aerial discharges is that the CPU 40 does not cause malfunction at 8 kV, and does not cause breakage at 15 kV. The malfunction here is typically freeze of the output image, etc. and is failure canceled by merely turning on or off the power source. It should be noted that the game machine 10 is generally used with the connector for peripheral equipment 30 and the AV connector 32 connected with the cables, and therefore, contact discharge shall not be performed. The ferrite ring 52 is Ni—Mn system and μ=550 (Murata Manufacturing Co., Ltd, FSRB090031RNB00B) in the test in this embodiment. As test equipment, static electricity testing equipment (item number ESS-2000) manufactured by Noise, Laboratory Co., Ltd is used.

As understood from FIG. 9, in the absence of the ferrite ring 52, malfunction occurs to the AV connector 32 at 7kV, and to the sensor bar connector 30 at 8kV on the side of the anode and at 9 kV on the side of cathode, so that the reference is not reached. However, in the presence of the ferrite ring 52, even application of 16 kV does not cause malfunction, so that the reference is cleared enough.

It should be noted that in this embodiment, a ferrite ring 52 is used, but it is considered that any rings capable of forming an inductor in cooperation with a protrusion 48c (that is, capable of heightening impedance of the protrusion 48c) can improve an ESD resistance even if the rings are made of magnetic materials except for ferrite (the extent of the improvement is dependent on the materials). However, by using rings made of ferrite, the conductive member becomes a high loss at a high frequency, so that a reduction effect of an EMI is more conspicuous, and an ESD resistance is satisfied.

Additionally, as a shape of the ferrite ring, the axial length may be shorter or longer than that of the ferrite ring 52 illustrated in the drawing (that is, it may be a doughnut shape and a cylinder shape). The upper and lower surfaces thereof may be an ellipse and a polygon. The component is not restricted to one formed by molding ferrite itself into a ring, but one formed by mixing ferrite with materials except for ferrite to mold it into a ring, and one formed by molding it by materials except for ferrite into a ring to apply powder of ferrite therewith. Alternatively, the ferrite ring may be divided and connected on attachment. A constant ESD resistance and a desirable ESD resistance can be obtained depending on the difference of the shape and the component with varying degrees.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic appliance having a circuit board, an electronic-circuit component mounted on said circuit board, and a metallic heat-dissipating member placed on said electronic-circuit component for dissipating heat generated in said electronic-circuit component, comprising:
    a shield covering said circuit board being grounded and on said circuit board, and arranged such that at least one surface of the shield is positioned in a vicinity of said heat-dissipating member, wherein the heat-dissipating member extends through and outward from the shield;
    a ground member for grounding said heat-dissipating member on said circuit board, wherein said ground member is in direct contact with a grounded surface of the circuit board; and
    a magnetic member arranged around a periphery of said ground member, wherein the periphery and the magnetic member are covered by the shield.

2. An electronic appliance according to claim 1, wherein said shield is formed with a slit, and at least a part of said heat-dissipating member extends through said slit.

3. An electronic appliance according to claim 2, wherein said heat-dissipating member comprises a heat-dissipating plate and a base supporting said heat-dissipating plate, said base is placed between said shield and said electronic-circuit component, and a part of said heat-dissipating plate is exposed through said slit.

4. An electronic appliance according to claim 3, further comprising a heat-conducting sheet having a top surface and a bottom surface which respectively are brought into intimate contact with a bottom surface of said base and a top surface of said electronic-circuit component.

5. An electronic appliance according to claim 1, wherein said magnetic member includes a ring-shaped ferrite.

6. An electronic assembly comprising:
    a printed circuit board;
    an electronic-circuit component mounted on said circuit board;
    a grounded, conductive heat sink attached to said electronic-circuit component, said heat sink including a ground member in direct contact with a grounded surface of the printed circuit board;
    a grounded, conductive electromagnetic shield covering the electronic-circuit component,
    wherein the heat sink extends through a slit in the shield and is attached to the electronic-circuit component and wherein a periphery of the heat sink is covered by the electromagnetic shield, and
    a magnetic member adjacent a periphery of the ground member of the conductive heat sink, wherein the magnetic member and heat sink are electromagnetically coupled and the magnetic member is between the electromagnetic shield and the electronic-circuit component.

7. The electronic assembly of claim 6 wherein the magnetic member is adjacent a periphery of a cylindrical portion of the heat sink.

8. The electronic assembly of claim 7 wherein the magnetic member includes a magnetic ring extending around the periphery of the heat sink.

9. The electronic assembly of claim 6 wherein the magnetic member includes a ferromagnetic material.

10. The electronic assembly of claim 6 wherein a gap exits between the slit in the shield and the heat sink and through which gap a portion of heat sink behind the shield is exposed.

11. The electronic assembly of claim 6 wherein an electrical impedance of the electromagnetic shield is lower than an electrical impedance of the electromagnetically coupled heat sink and magnetic member.

* * * * *